(12) United States Patent
Gruendler et al.

(10) Patent No.: US 8,631,706 B2
(45) Date of Patent: Jan. 21, 2014

(54) NOISE SUPPRESSOR FOR SEMICONDUCTOR PACKAGES

(75) Inventors: Nickolaus J Gruendler, Manor, TX (US); Paul M Harvey, Austin, TX (US); Tae Hong Kim, Round Rock, TX (US); Sang Y Lee, Austin, TX (US); Michael J Shapiro, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 853 days.

(21) Appl. No.: 12/840,861

(22) Filed: Jul. 21, 2010

(65) Prior Publication Data
US 2012/0020042 A1    Jan. 26, 2012

(51) Int. Cl.
G01L 9/12       (2006.01)
H01R 9/00       (2006.01)
H05K 7/20       (2006.01)

(52) U.S. Cl.
USPC ............ 73/718; 73/724; 361/718; 361/773

(58) Field of Classification Search
USPC .................................... 73/700–756
See application file for complete search history.

(56) References Cited

U.S. PATENT DOCUMENTS

| | | | |
|---|---|---|---|
| 4,502,101 A * | 2/1985 | Jodoin | 361/718 |
| 4,577,258 A * | 3/1986 | Jodoin | 361/321.3 |
| 4,636,918 A * | 1/1987 | Jodoin | 361/773 |
| 6,002,593 A | 12/1999 | Tobya | |
| 6,252,177 B1 | 6/2001 | Stoddard | |
| 6,404,649 B1 | 6/2002 | Drake et al. | |
| 6,459,561 B1 | 10/2002 | Galvagni et al. | |
| 6,961,231 B1 | 11/2005 | Alexander et al. | |
| 7,268,302 B1 | 9/2007 | Smith | |
| 7,309,916 B2 | 12/2007 | Kang | |
| 7,323,787 B2 | 1/2008 | Chan | |
| 7,508,062 B2 | 3/2009 | Miller | |
| 2004/0226735 A1 * | 11/2004 | Wu et al. | 174/52.1 |
| 2006/0139123 A1 | 6/2006 | Tang | |

OTHER PUBLICATIONS

Technical Disclosure, IP.COM No. IPCOM000126161D, entitled, "Device to Facilitate use of Capacitors on backside of a module without cutting holes in the card", published Jul. 5, 2005, , Author: IBM.

Technical Disclosure, IP. COM No. IPCOM 000006852D, entitled "Method of providing mechanical support for a periphery array BGA package with land-side capacitors to ensure compatibility with a PGA package", published Feb. 6, 2002, by Anonymous.

Technical Disclosure, IP.COM No. IPCOM 000008064D, entitled "Method of providing support to land-side decoupling capacitors for an electronic package assembly", published May 15, 2002, by Anonymous (See Figs. 2 and 3).

Technical Disclosure, IP.COM No. IPCOM 000123217D, Entitled "A Scheme of Decoupling for PGA Socket", published Apr. 4, 2005, by Hoang, et. al. (paragraphs 4, 5, and 6).

* cited by examiner

Primary Examiner — Andre Allen
(74) Attorney, Agent, or Firm — Joscelyn Cockburn

(57) ABSTRACT

One or more decoupling capacitors are coupled to a low inductance mount that is connected to the bottom layer of a printed circuit board (PCB) on which a semiconductor module is mounted. The low inductance mount includes a magnetic planar structure with vias that are coupled to the one or more decoupling capacitors and to like vias positioned on the PCB.

21 Claims, 7 Drawing Sheets

NOISE SUPPRESSOR FOR SEMICONDUCTOR PACKAGES

BACKGROUND OF THE INVENTION

The description herein relates to semiconductor packages, and more specifically to devices and systems for suppressing noise generated within the semiconductor packages.

In a conventional semiconductor package, a semiconductor chip is positioned in a space provided on a printed circuit board (PCB). The semiconductor chip is connected to the PCB via connectors in the part of the chip termed Ball Grid Array (BGA). The PCB provides the intra structure (such as vias, conducting planes including ground and power, wiring etc.) which enables the chip to communicate internally and externally to perform the functions for which it was designed.

In order to facilitate high speed and high performance operation a decoupling capacitor (also known as de-cap) is usually mounted on the PCB between the ground and power planes. The de-cap is required to suppress power/ground noise and provide components with stable power. However, the parasitic inductance associated with power distribution networks and mounting pads for de-caps are factors limiting the performance and effectiveness of de-caps. The parasitic inductance can cause unwanted resonance and when this occurs using de-caps may be more harmful than beneficial. The parasitic inductance is influenced by the location where de-caps are placed on the PCB. However, due to the complexity of high speed systems space on the PCB is at a premium. As a consequence, de-caps are usually not placed at the optimum locations on the PCB but rather at location where space is available. The practice of placing de-caps on the PCB where space is available tends to increase the length of the conductor which in turn increase the parasitic inductance. The problem is even exacerbated with BGA packages because the fan-out signals from the BGA make it almost impossible to place de-caps at optimum location on the PCB. The optimum locations would be those locations on the PCB where the parasitic impedance would be reduced. Even if the de-caps were to be placed at the optimum locations, they would not abate the vertical noise that is generated as a result of the parasitic inductance.

BRIEF SUMMARY

According to one exemplary embodiment an apparatus that suppresses noise generated within a semiconductor package includes a low inductance mount and at least one decoupling device positioned within the low inductance mount. The low inductance mount includes two planar members arranged in spaced relation. A magnetic film is deposited on one of the planar members and a plurality of vias (holes) is fabricated in said one of the planar members. At least one decoupling device (such as a decoupling capacitor) is placed on the inside surface of the other member. The two planar members may be joined at the peripheries, with the decoupling device positioned between the two planar members. A first conductor is connected to a first terminal of the decoupling device and a second conductor is connected to a second terminal of the decoupling device. The at least one decoupling device is placed so that the first conductor and the second conductor are of minimum lengths and in linear alignment with a first via and a second via, on said one of the planar member, which are aligned with selected conductive pads on the underside of a printed circuit board. The conductive pads could be provided as vias in the PCB. In order to be effective, the apparatus is mounted on the bottom of the PCB, with the magnetic film facing the underside of the PCB, the first conductor, and the second conductor operatively coupled to the selected conductive pads.

DETAILED DESCRIPTION

Figure 1:
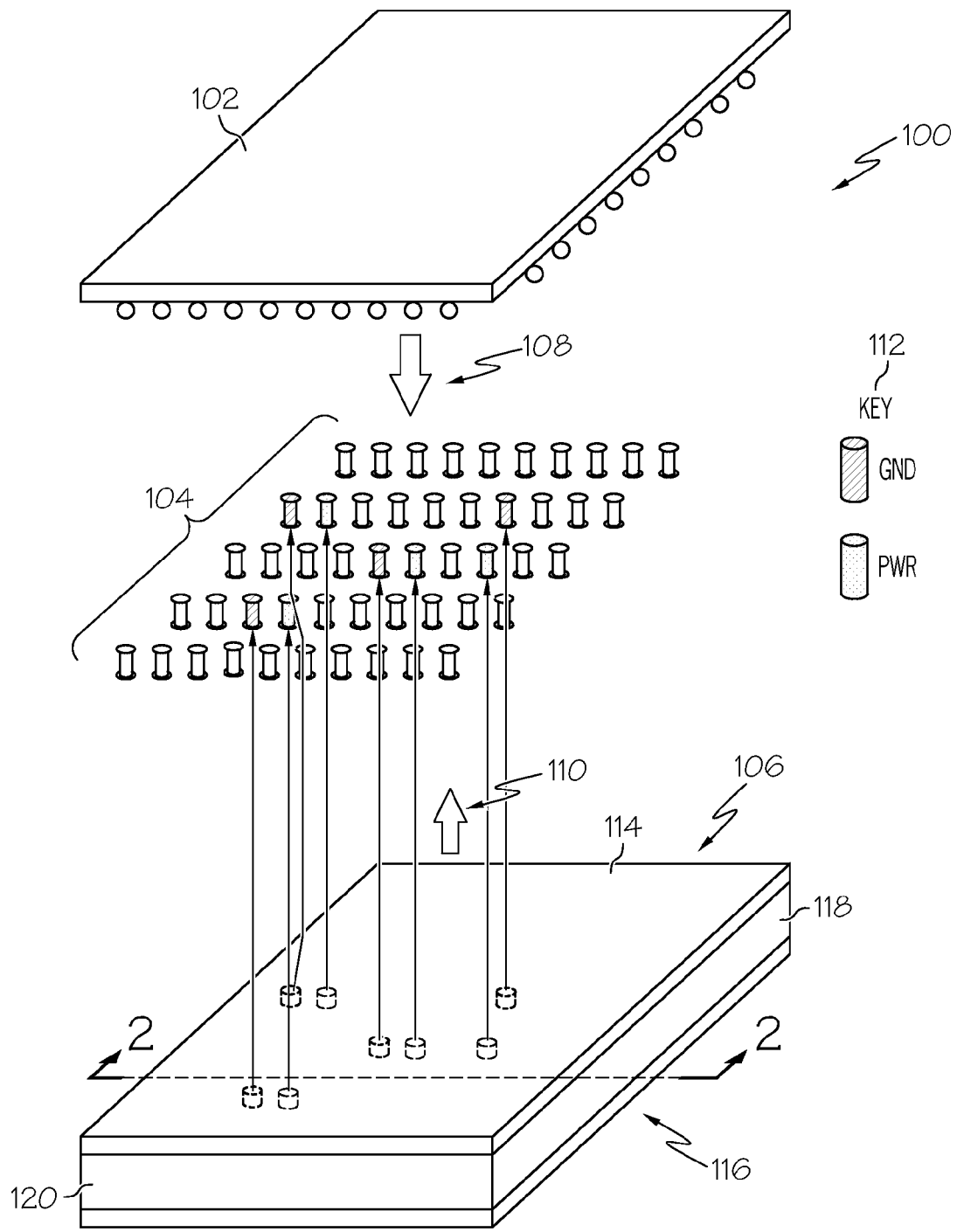
FIG. 1 depicts an exploded isometric view of a semiconductor package in accordance with an exemplary embodiment.

FIG. 1 shows an exploded isometric view of a semiconductor package 100 according to teachings of the description herein. The semiconductor package 100 includes semiconductor chip or semiconductor module 102, PCB 104, and noise suppressor 106. Arrows 108 and 110 show respective directions in which the semiconductor chip 102 and noise suppressor 106 are moved to assemble the semiconductor package into a unified structure. When assembled, the semiconductor chip 102 is mounted on the top layer of the PCB 106 and the noise suppressor is connected to the bottom layer of the PCB 106. The key 112 illustrates the patterns or markings used to differentiate between ground (GND) via and power (PWR) vias. As will be described in greater details hereafter, the ground and power terminals are provided as separate contacts, in the semiconductor chip 102, which are connected to PWR via and GND vias in printed circuit board 104 and noise suppressor 106.

Still referring to FIG. 1, semiconductor chip or module 102 includes a section with circuits, components, etc. that allows the module to perform the functions for which it was designed and a section termed ball grid array (BGA) used to attach the chip to the PCB. It should be noted that semiconductor chip and semiconductor module are used interchangeably within this document. The BGA are shown as balls on the undersurface of the module 102. The depiction in FIG. 1 only shows two rows of balls; however, in an actual chip several rows of balls are provided which includes one or more balls for power connections and one or more balls for ground connections. As a consequence, the showing of two rows should be construed as a demonstration rather than a limitation on the scope of the noise suppressor.

The PCB 104 is multi layered. However, for simplicity only the bottom layer of the PCB is shown. This is the layer to which the noise suppressor 106 is connected and is shown herein to provide context to describe an exemplary embodiment of the noise suppressor. An example of a multi layer PCB will be described hereafter; however one of ordinary skill in the art will appreciate that the showing of the bottom layer of the PCB is sufficient to understand an embodiment describe herein. The bottom layer of the PCB includes four ground (GND) vias and four power (PWR) vias. The GND and PWR vias are identified by corresponding markings shown in key 112. For example, the GND vias are shown by cross hatch of incline lines, whereas the PWR vias are shown by different markings. The GND vias and the PWR vias, on the bottom layer of the PCB, are arranged in pairs and positioned in alignment with respective PWR balls and GND balls in the BGA of the module.

Still referent to FIG. 1, the noise suppressor 106 controls noise generated in the multilayer PCB and allows the system to operate in the high frequency range. The noise suppressor 106 includes a low impedance mount formed from a first planar member 114 and a second planar member 116 spaced a predetermined distance from the first planar member 114. The planar members are arranged so that the first planar member 114 is designated as the top planar member that is attached to the bottom surface of PCB 104. The second planar member 116 is designated as the bottom planar member and is spaced a predefined distance from the top planar member. A plurality of GND vias and PWR vias are fabricated in top planar member 114. The arrangement is such that each GND vias is paired with a PWR vias. The identity of the GND vias or PWR vias is determined by the designation shown by key 112 Stated another way the PWR vias on top planar member 114 are identified by the same marking shown in key 112 for PWR. Likewise, the GND vias is marked with the same markings as GND in KEY 112. Each PWR/GND pair on the top planar surface 114 is positioned to be in linear alignment with a like pair on the PCB 104. In addition, top planar member 114 is provided with magnetic material so that it functions as a magnetic shield to block vertical noise originating in the PCB. More detailed discussion of the vertical noise and the blocking function of the top planar member is given hereafter. The magnetic characteristics of the top planar member 114 may be provided by depositing a magnetic film on the outer surface. Alternately, the magnetic characteristics of top planar member 114 can be provided by integrating magnetic material. The top planar member 114 could be joined by side members 118, 120, and opposite matching side members 122 and 124 (not shown in FIG. 1). In an alternate embodiment, the low inductance mount has no side members. Instead, the top planar member 114 is connected to the bottom planar member 116 by connecting the conducting members from the terminals of the decoupling capacitors to selected ones of the GND/PWR vias in top planar member 114.

Figure 2:
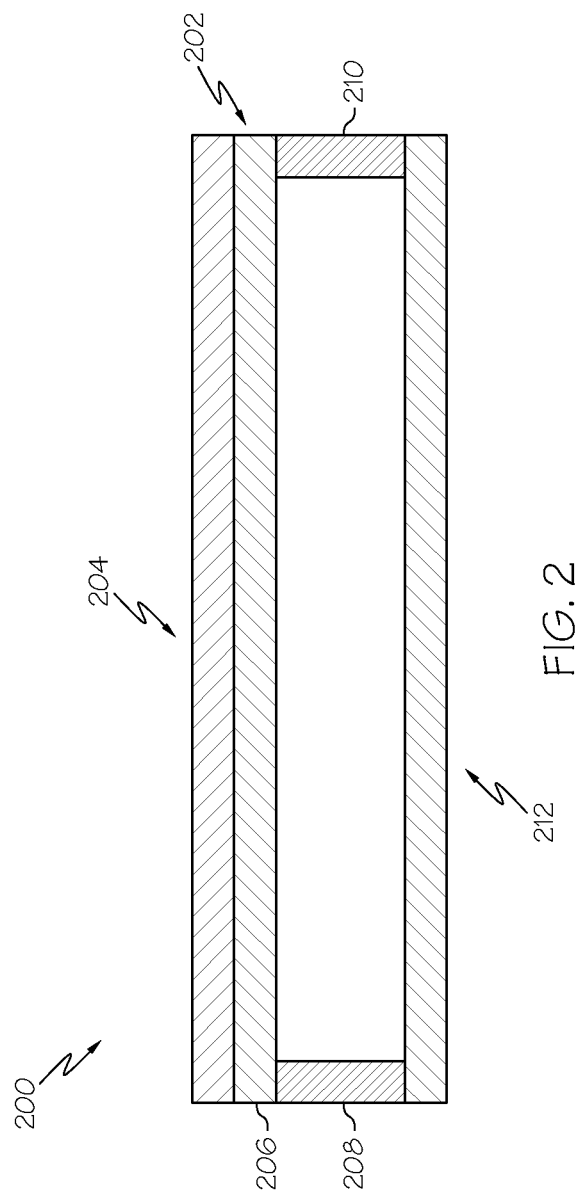
FIG. 2 depicts an exemplary cross section of the mount that attaches the decoupling capacitor to the printed circuit board (PCB).

FIG. 2 shows a cross section 200 for the boxlike low inductance mount of FIG. 1. In order to correlate features of FIG. 2 with like features of FIG. 1 common names are used. However, different numerals are used to indicate the parts are associated with different Figures. Top planar member 202 includes magnetic film 204 deposit on substrate 206. As discussed above the magnetic material can be integrated in substrate 206. In such a case the magnetic film may not be needed. Alternately, the magnetic film could still be used with an appropriate concentration of magnetic material in the substrate. It is clear from this discussion that several fabricating processes can be used to generate the magnetic material for top planar member 202.

Still referring to FIG. 2, side members 206 and 210 interconnects bottom planar member 212 to top planar member 202. As will be discussed in details hereafter bottom planar member 212 supports the decoupling capacitors. As discussed above, an exemplary embodiment does not use side members. Instead the bottom planar member 212 is joined to the top planar member 202 by vias and conducting wires (not shown in FIG. 2).

Figure 3:
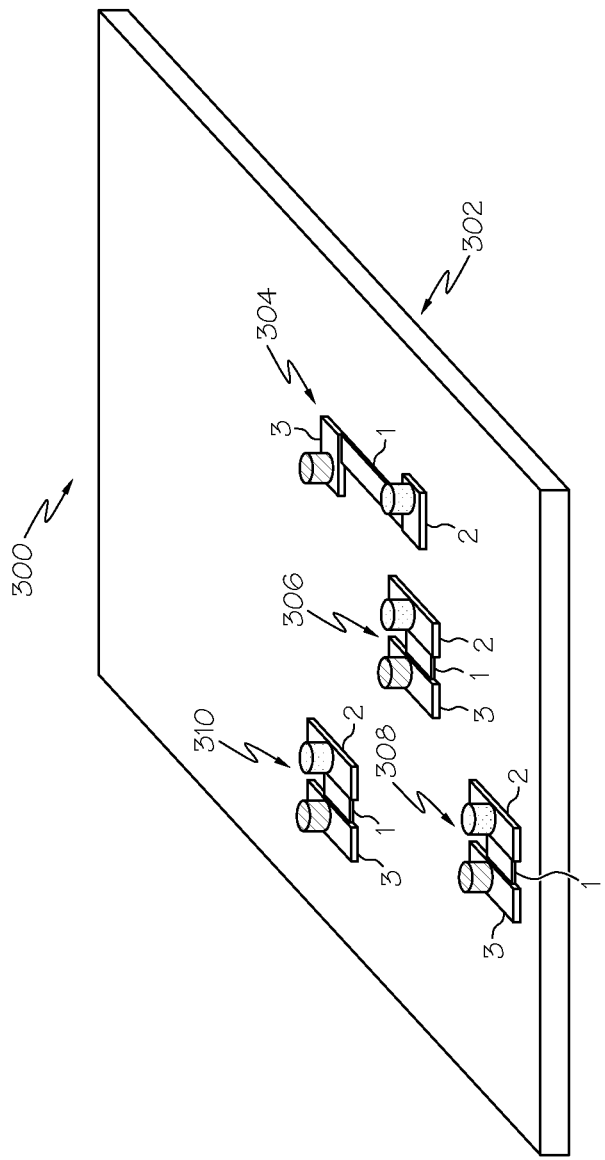
FIG. 3 depicts decoupling capacitors mounted on a planar structure.
Figure 4:
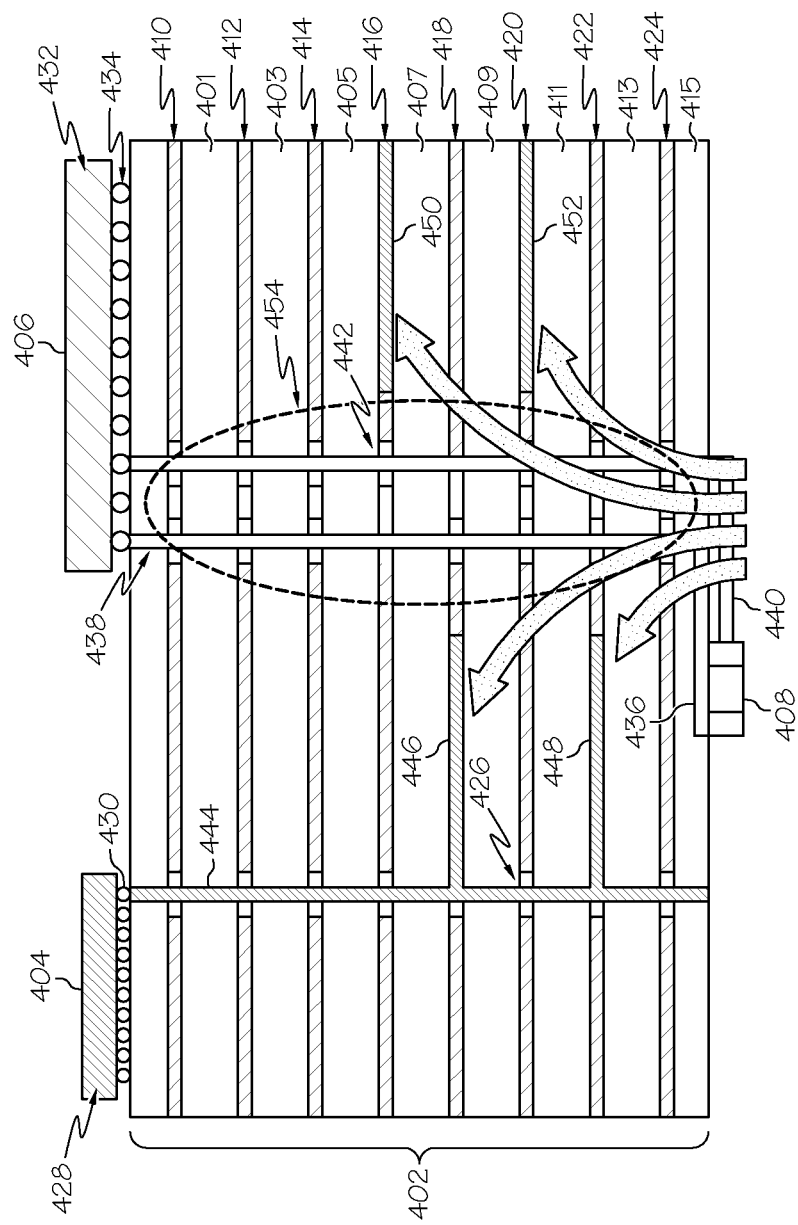
FIG. 4 depicts an exemplary cross section of a multi-layered PCB and arrows demonstrating vertical noise originating within the multi-layered PCB.

FIG. 3 shows the bottom section 300 of the noise suppressor that decouples noise between conducting planes such as the GND plane and the PWR plane. The bottom section includes bottom planar member 302 and decoupling capacitors 304, 306, 308, and 310. The decoupling capacitors are mounted on the bottom planar member. The number of decoupling capacitors is a matter of design choice; so even though four capacitors are shown in FIG. 4 this should be construed as exemplary and not as a limitation on scope. Stated another way, the number of capacitors is N, where N equals any number the designer chooses. The structure of all capacitors may be the same. Therefore, the description of one is intended to cover the description of all. Each of the capacitor has a body section labeled 1 operatively connected to a first terminal labeled 2 and a second terminal labeled 3. For each of the capacitor, terminal 3 is connected to a conductive member, such as a conductive wire, labeled with the markings representing GND. Likewise, terminal 2 is connected to a conductive member, such as a conducting wire, label with the markings representing PWR. It should be noted that these designations and connections may be changed or reversed without departing from the teachings herein.

Still referring to FIG. 3, each capacitor is positioned on the bottom planar member 302 so that the GND and PWR conductive wires fall below and in linear alignment with the corresponding GND/PWR of the semi conductive package. Likewise, GND and PWR conductors at each of the capacitors are below and in linear alignment with corresponding GND/PWR vias on the top linear planar member. As a consequence of the placement and orientation of the capacitors, the conductive wires for each one is at a minimum and relatively short. In addition, each of the decoupling capacitor is placed closer to the corresponding GND/PWR of the package than was heretofore been possible. As will be demonstrated below, the short conductive wires and closeness of the capacitor to the corresponding GND/PWR of the package eliminate or significantly reduce parasitic inductance which neutralizes the effect of decoupling capacitors and could limit use of the semiconductor package in high speed environment. By eliminating the parasitic inductance the semiconductor package can be used effectively in high speed environments.

FIGS. 4, 5, 6, and 7 depict structures and graphical representations to demonstrate the effectiveness of an exemplary noise suppressor according to the description herein in controlling all type of noises that originate within a semiconductor package. The noises may include vertical noise (discussed in more detail below) and/or noise that are coupled between conducting planes, such as PWR/GND planes. By controlling all type of noises semiconductor packages that are equipped with the noise suppressor embodiment describe herein may function effectively in low speed and high speed environments. Usually, low speed relates to operating speed in MHz range, whereas high speed relates to operating speed within KHz range Referring to FIG. 4, a cross-sectional view of a semiconductor package 400 is shown. The semiconductor package includes a multilayered substrate 402 such as a printed circuit board (PCB), semiconductor modules 404, 406, and decoupling capacitor 408. The PCB includes a plurality of conducting planes 410, 412, 414, 416, 418, 420, 422, and 424 separated by a plurality of non conducting planes 401, 403, 405, 407, 409, 411 413, and 415. A plurality of vias such as the one labeled 426, provide interconnections between respective layers. To minimize cluttering of the Figure the other vias are shown but numerals are not assigned to them. Each of the modules 404 and 406 are mounted to the top non conductive layer of the PCB. Module 404 has a section 428 containing the circuitries that allow the module to perform the function for which it was designed and a ball grid array (BGA) 430 for attaching the module to the PCB. Likewise, module 406 has section 432 containing circuits that perform the functions for which the module was designed and BGA 434 for attaching the module to the PCB.

Still referring to FIG. 4A, capacitor 408 is connected to bottom non conductive layer 415 of PCB 402. A first conductor 436 connects a first terminal of capacitor 408 to a conductor 438 originating from a first element in BGA 434. A second conductor 440 connects a second terminal of capacitor 408 to conductor 442 originating from a third element of the BGA 434. Conductor 438 and conductor 442 are threaded through the PCB prior to joining with first conductor 436 and second conductor 440. The first element of BGA 434, connected to conductor 438, is designated GND and the third element of BGA 434, connected to conductor 442, is designated PWR The designation of GND to the first element of BGA 434 and the designation of PWR to the third element of BGA 434 can be switched so that the third element of the BGA 434 is GND and the first element of BGA 434 is PWR. The capacitor 408 prevents signals on the chip GND from coupling into the chip PWR. As a consequence, the capacitor is known as the decoupling capacitor.

Still referring to FIG. 4, a full circuit, originating from chip 404 and interconnected by conductors 444, 446, and 448, is shown. In addition, conductors 450 and 452 are shown. The conductors 444 and 446 could be related to other full circuits (not shown). As will be explained in greater details below, vertical noise (shown by arrows in FIG. 4) originating from the de-cap wires at the bottom of the PCB couples into conductors 446, 448, 450, and 452, respectively. Space for mounting components on the PCB are at a premium and are reserved for mounting components that are necessary to implement the functions for which the chip was designed. As a consequence, decoupling capacitors are relegated to space on the periphery of the PCB or on the bottom of it. This placement requires that the de-cap wires, such as conductors 436 and 440 (FIG. 4), joining the decoupling capacitor to the GND/PWR of the chip are relatively long. The de-cap wires generate parasitic inductance that couples with other circuits in the PCB and reduce the effectiveness of the decoupling capacitor. The problem worsened as the frequency of operation increases. The cross coupling is termed Vertical Noise in this document and some are shown by arrows in FIG. 4. It should be noted that the arrows represents only a small part of all the noise components as there would be a lot more wires on each layers that couples with the de-cap wires. The structure inside of ellipse 454 is modeled on a three dimension (3-D) electromagnetic (EM) solver whose output represents a plot of the EM field distribution of the structure that was modeled on the solver.

Figure 5:
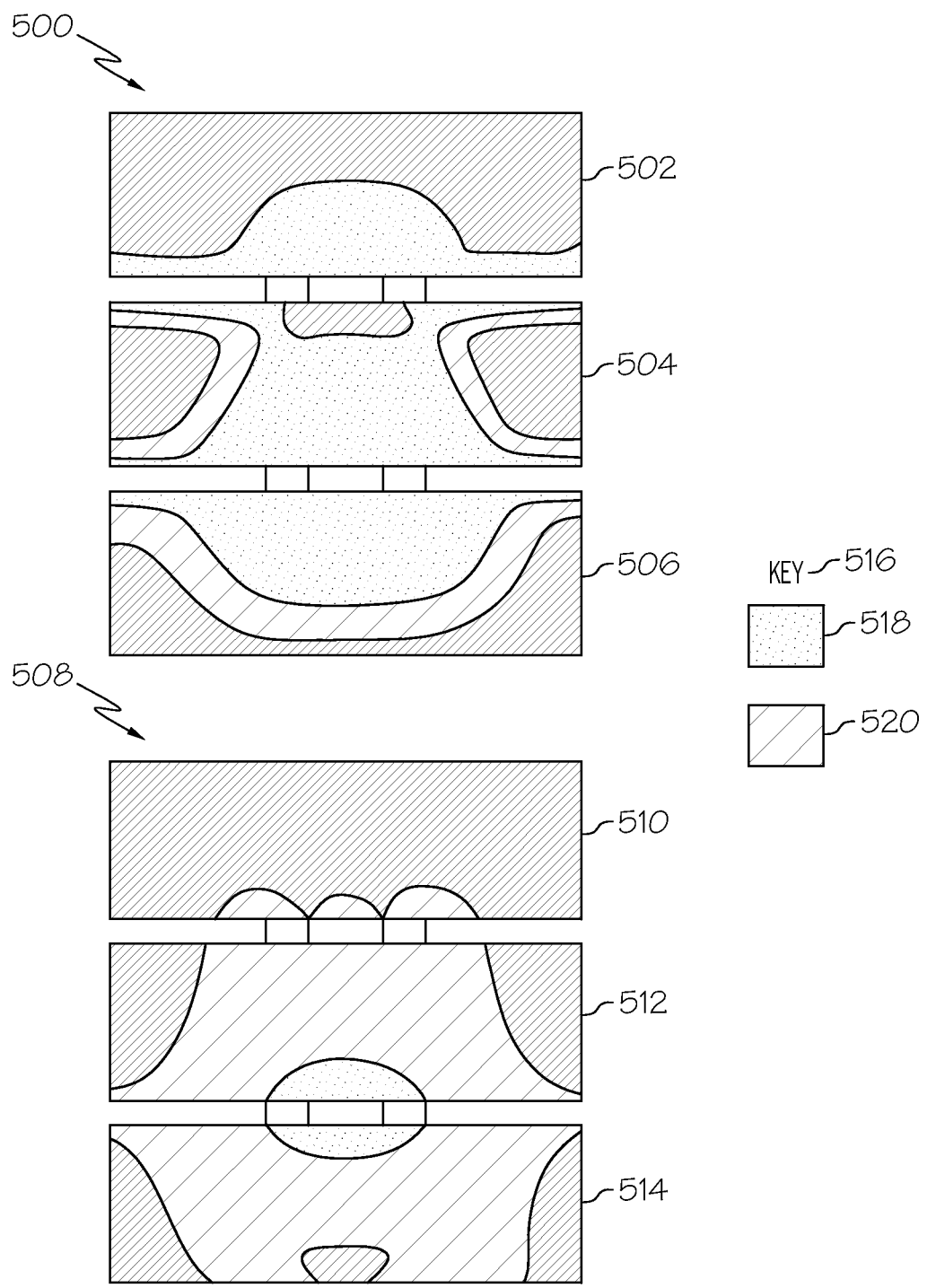
FIG. 5 depicts an exemplary printout generated by a 3-D electromagnetic solver machine demonstrating electromagnetic (EM) intensity associated with an input structure selected from the multi-layered PCB of FIG. 4.

FIG. 5 shows the output 500, hereafter term printout 500, by the 3-D EM solver for the structure (identified above) that was modeled. The print out shows six layers 502, 504, 506, 510, 512 and 514 separated by a void 508 for the modeled structure. The EM field distribution is a representation of vertical noise generated in the PCB. The patterns shown in KEY 516 represent the intensity of noise coupling. The pattern of dots shown in element 518 and throughout the printout represent the highest noise coupling. The pattern of widely displaced cross hatching shown in 520 and throughout the printout represents the least noise coupling.

Figure 6:
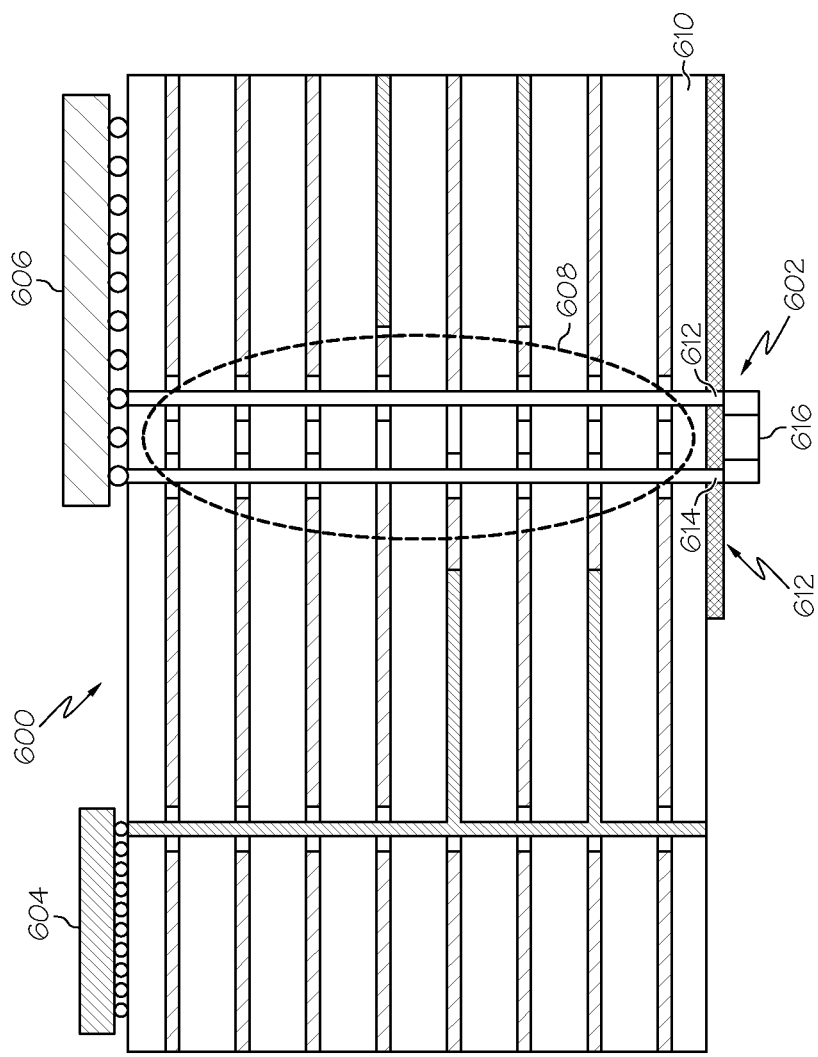
FIG. 6 depicts a cross section of a multi-layered PCB with a noise suppressor according to an exemplary embodiment.

FIG. 6, except for the noise suppressor 602, depicts a cross sectional view of a PCB identical to the one in FIG. 4, described above. The PCB structures and areas modeled on the EM field solver are chosen to be identical in FIG. 4 and FIG. 6 to demonstrate that use of noise suppressor 602 reduces noise coupling to almost zero, whereas noise coupling is intense without use of the noise suppresser. It should be noted that like features, such as chips, conductors, layers, etc. in FIG. 4 and FIG. 6 are shown with like markings. For example, chip 604 has cross hatchings like chip 404, chip 606 has cross hatchings like chip 406, ellipse 454 and ellipse 608 identify the same structure for modeling on the EM solver, and so forth. As a result of the similarities the description set forth above relative to FIG. 4 can be easily mapped to describe FIG. 6. Therefore, only those features of FIG. 6 that are not common to FIG. 4 will be discussed further in this document.

Still referring to FIG. 6, noise suppressor 602 is attached to the outer surface of bottom layer 610 of the PCB. Noise suppressor 602 is developed and attached according to an exemplary embodiment of the type set forth above. Suffice it to say the noise suppressor 602 includes magnetic shield 612 including GND vias 614 and PWR vias 616. The GND vias and PWR vias are connected to like elements (GND and PWR) of the chip 606 that are made available at the bottom of the PCB. The magnetic shield 612 can be a laminated structure having a substrate on which a magnetic film is deposit. When mounted the magnetic film would face the bottom surface of the bottom layer of the PCB. Alternately, the magnetic material could be integrated in the substrate. The terminals of decoupling capacitor 616 are operatively connected to the GND vias and PWR vias in the magnetic shield. If required, short conductors may be used to connect appropriate terminals of decoupling capacitor 616 to appropriate ones of the GND/PWR vias in the magnetic shield 612. By using the noise suppressor 602 on the PCB shown in FIG. 6 with its structure identical to the structure of the PCB shown in FIG. 4, the vertical noises shown by arrows in FIG. 4 are eliminated.

Figure 7:
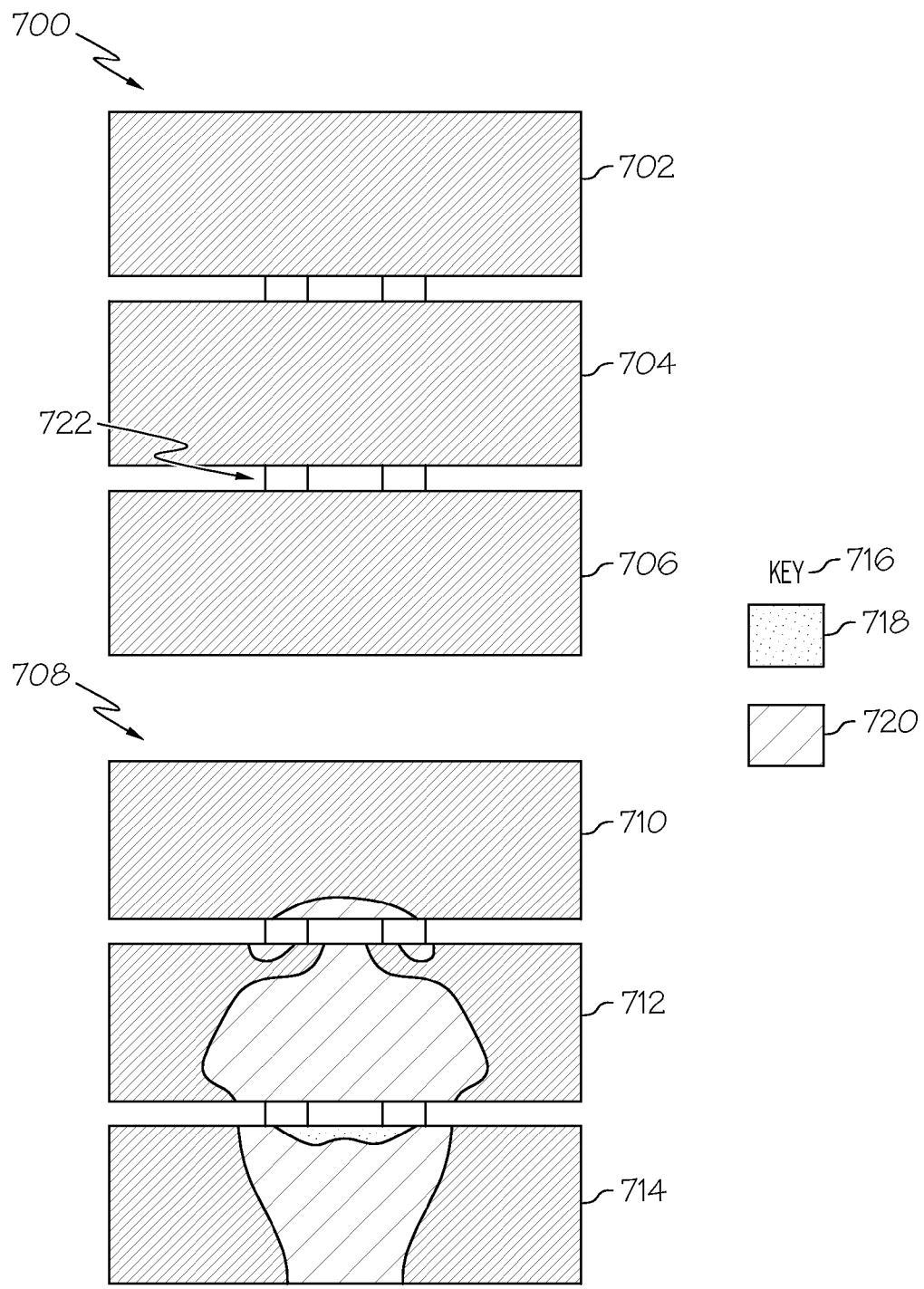
FIG. 7 depicts an exemplary print out from a 3-D electromagnetic solver machine demonstrating electromagnetic (EM) intensity associated with an input structure selected from an exemplary multi-layered PCB such as that shown in FIG. 6.

FIG. 7 shows printout 700 by the EM solver of the structure identified in FIG. 6 and entered into the solver. The printout in FIG. 5 and the printout in FIG. 7 are generated from like semiconductor structures. The printout in FIG. 7 includes six layers 702, 704, 706, 710, 712, 714 and a void 708. The vertical channels, such as 722, are vias joining layers. The KEY 716 discloses the markings 718 and 720 that are present in the printout. As discussed above, the intensity of the EM field is a measure of the vertical noise level within the substrate. In KEY 716 and the printout, 718 represents highest noise level and 720 represents least noise level.

Referring to FIG. 5 and FIG. 6, the markings representative of noise are identical. The semiconductor structures that are modeled to generate the printouts are identical. Therefore, a comparison can be made between the two printouts to determine the effectiveness of an exemplary noise suppressing apparatus as describe herein. In making the comparison the relative size of respective noise components is a measure of the effectiveness of an exemplary embodiment. With respect to high intensity noise (represented by 518, KEY 516 and 718, KEY 718), except for a small amount shown in layer 714, it is eliminated from the semiconductor system that uses the noise suppressor apparatus. With respect to the low intensity noise (represented by 520, KEY 516 and 720, KEY 716), it is reduced significantly showing traces in layers 710, 712, and 714. It is clear from the above that attaching the noise suppresser to the bottom of the PCB as shown and described in the disclosed exemplary embodiment results in a substantial reduction in vertical noise coupling. As a consequence, the effectiveness of the decoupling capacitor is restored. Other benefits of the exemplary embodiment describe herein include minimizing parasitic inductance by being able to place decoupling capacitors as close as possible to the semiconductor chip and maximizing signal routing by mounting the decoupling capacitor off the PCB.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description herein has been presented for purposes of illustration and description, but is not intended to be exhaustive or limited to the invention in the form disclosed. Many modifications and variations will be apparent to those of ordinary skill in the art without departing from the scope and spirit of the invention. The exemplary embodiment was chosen and described in order to best explain the principles of the invention and the practical application, and to enable others of ordinary skill in the art to understand the invention for various embodiments with various modifications are suited to the particular use contemplated.

What is claimed is:

1. An apparatus comprising:
   a first support structure;
   a plurality of vias fabricated on said first support structure;
   at least one decoupling device;
   a first conductive member interconnecting a first terminal of the at least one decoupling device to a first selected one of the plurality of vias; and
   a second conductive member interconnecting a second terminal of the at least one decoupling device to a second selected one of the plurality of vias wherein said at least one decoupling device is linearly displaced from the first support structure, said first conductive member, and said second conductive member being of minimum lengths to enable attachment of said decoupling device to the first selected one of the plurality of vias and the second selected one of the plurality of vias.

2. The apparatus of claim 1 further including a second support structure operatively positioned to support the at least one decoupling device; and a magnetic film fabricated on one surface of the first support structure wherein said magnetic film blocks virtual noise from occurring between external sources, said first conductive member, and said second conductive member.

3. The apparatus of claim 1 wherein the first support structure includes a planar member.

4. The apparatus of claim 2 wherein the second support structure includes a planar member.

5. The apparatus of claim 1 wherein the first support structure is fabricated from magnetic material.

6. The apparatus of claim 2 further including mechanical connectors for joining the first support structure and the second support structure.

7. The apparatus of claim 1 wherein the first conductive member includes conductive wires.

8. The apparatus of claim 7 wherein the second conductive member includes conductive wires.

9. The apparatus of claim 1 wherein the decoupling device includes a capacitor.

10. The apparatus of claim 9 wherein the capacitor includes a positive plate connected to the first terminal and a negative plate connected to the second terminal.

11. A system comprising:
    a printed circuit board, including at least a first predefined via and a second predefined via;
    at least one semiconductor chip operatively mounted on said printed circuit board; and
    an apparatus for suppressing noise generated within said system operatively connected to the bottom of said printed circuit board, said apparatus comprising a first planar structure including magnetic material; a first via fabricated on said first planar structure; a second via placed in spaced relation to the first via fabricated on said first planar structure; at least one decoupling capacitor linearly displaced from a bottom surface of said printed circuit board; a first conductive member for coupling a first terminal of said at least one capacitor to said first predefined via on said printed circuit board and a second conductive member for coupling a second terminal of said at least one capacitor to said second predefined via on said printed circuit board.

12. The system of claim 11 wherein the first predefined via represents a ground (GND) connection and the second predefined via represents a power (PWR) connection.

13. The system of claim 11 further including a second planar structure displaced relative to the first planar structure and supporting the at least one capacitor.

14. The system of claim 11 wherein the first via on the first planar member is connected to the first predefined via and the second via on the first planar member is connected to the second predefined via.

15. The system of claim 11 wherein the magnetic material includes a magnetic film positioned between the bottom surface of the printed circuit board and an outside surface of the first planar member.

16. The system of claim 11 wherein the magnetic material is integrated in the first planar member.

17. The system of claim 11 wherein the first predefined via is in linear alignment with the first via on the first planar member and the second predefined via is in linear alignment with the second via on the first planar member.

18. A method comprising:
    providing a printed circuit board (PCB) including a ground attachment member and a power attachment member at a bottom surface of said PCB;
    providing a planar structure including a first via spaced relative to a second via fabricated in said planar structure;
    interposing a magnetic film between the bottom surface of said PCB and the planar structure;
    aligning the planar structure relative to the bottom surface of said PCB so that the first via is in linear alignment with the ground attachment member and the second via is in linear alignment with the power attachment member; and
    attaching the first via to the ground attachment member and the second via to the power attachment member.

19. The method of claim 17 further including providing a decoupling capacitor, operatively connecting a first terminal of the decoupling capacitor to the first via, and operatively connecting a second terminal of the decoupling capacitor to the second via.

20. The method of claim 17 wherein attachment is achieved by soldering.

21. The method of claim 17 wherein attachment is achieved by ultrasonic methods.

* * * * *